(12) United States Patent
Klein, Jr.

(10) Patent No.: US 11,733,190 B2
(45) Date of Patent: Aug. 22, 2023

(54) METHOD AND SYSTEM FOR MEASUREMENT OF IMPEDANCE OF ELECTROCHEMICAL DEVICES

(71) Applicant: Alliance for Sustainable Energy, LLC, Golden, CO (US)

(72) Inventor: Walter Ellis Klein, Jr., Greybull, WY (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 17/750,517

(22) Filed: May 23, 2022

(65) Prior Publication Data

US 2022/0381719 A1 Dec. 1, 2022

Related U.S. Application Data

(60) Provisional application No. 63/193,343, filed on May 26, 2021.

(51) Int. Cl.
*G01N 27/04* (2006.01)
*G01R 31/396* (2019.01)

(52) U.S. Cl.
CPC ......... *G01N 27/045* (2013.01); *G01R 31/396* (2019.01)

(58) Field of Classification Search
CPC . G01N 27/045; G01N 27/4163; G01R 31/396
See application file for complete search history.

(56) References Cited

U.S. PATENT DOCUMENTS

| | | | |
|---|---|---|---|
| 6,906,523 B2 | 6/2005 | Bertness et al. | |
| 7,425,832 B2 | 9/2008 | Gopal et al. | |
| 7,925,349 B1 | 4/2011 | Wong et al. | |
| 9,317,055 B2 | 4/2016 | Egami et al. | |
| 9,851,414 B2 | 12/2017 | Morrison et al. | |
| 9,962,949 B2 | 5/2018 | Ghozeil et al. | |
| 9,983,158 B2 | 5/2018 | Morgan et al. | |
| 10,379,168 B2 | 8/2019 | Christophersen et al. | |
| 10,753,986 B2 | 8/2020 | Taylor et al. | |
| 2005/0287402 A1* | 12/2005 | Maly | H01M 8/04597 429/432 |
| 2017/0003354 A1* | 1/2017 | Morrison | G01R 31/3842 |
| 2020/0386820 A1 | 12/2020 | Harper et al. | |
| 2021/0006077 A1 | 1/2021 | Rentel | |
| 2023/0104336 A1* | 4/2023 | Eriksson | G01R 31/3648 324/430 |

FOREIGN PATENT DOCUMENTS

| | | | | |
|---|---|---|---|---|
| KR | 101629579 B1 * | 6/2016 | | G01R 19/00 |
| KR | 102509408 B1 * | 3/2023 | | G01R 19/04 |

* cited by examiner

*Primary Examiner* — Jay Patidar
(74) *Attorney, Agent, or Firm* — Michael A. McIntyre

(57) ABSTRACT

The present disclosure provides methods for determining impedance of an electrochemical device by electrically connecting a variable impedance in parallel with the electrochemical device; electrically connecting a power supply to the electrochemical device, the power supply generating a power supply current; modulating a current through the variable impedance; measuring a stack current flowing through the electrochemical device; measuring, at the electrochemical device, a voltage across at least a portion of the electrochemical device; and calculating, based on the measured stack current and the measured voltage, the impedance of the electrochemical device. Systems for performing such methods are also provided.

22 Claims, 6 Drawing Sheets

METHOD AND SYSTEM FOR MEASUREMENT OF IMPEDANCE OF ELECTROCHEMICAL DEVICES

CROSS-REFERENCE TO RELATED APPLICATIONS

This application claims priority from U.S. Provisional Patent Application No. 63/193,343 filed on May 26, 2021, the contents of which are incorporated herein by reference in their entirety.

CONTRACTUAL ORIGIN

This invention was made with government support under Contract No. DE-AC36-08GO28308 awarded by the Department of Energy. The government has certain rights in the invention.

SUMMARY

Measuring the electrical impedance of electrochemical storage and conversion is highly desirable and can provide insight into operational efficiency and degradation effects present. The present disclosure provides a method to measure impedance of electrochemical cells at any scale of operation, which is not currently available. While embodiments provided by the present disclosure find utility in high current (>30 A) applications, the disclosed methods and systems are applicable to any current level.

In various aspects, the present disclosure provides methods for the measurement of electrochemical device impedance as an integrated statement of the health of such device. The disclosed methods and systems subtract current, during steady state operation, from an electrochemical device via a variable resistive load arranged in parallel with the electrochemical device. This is in contrast to known methods, which add current to the device or modulate power via a load in series. By subtracting current, the methods and systems provided by the present disclosure can be easily integrated into numerous systems, regardless of characteristics of power supply or electrochemical device.

Embodiments provided by the present disclosure connect a variable impedance in parallel with an electrochemical device, whereby the variable impedance draws or pulls away a portion of current intended to flow into the electrochemical device. By modulating the current flowing into the variable impedance, the current flowing into the electrochemical device is also modulated. The modulated current may then be measured and, along with voltage measurements, can be used to determine the impedance of the system (and/or components thereof), which may provide an indicator of the health or efficiency of the system (and/or components thereof) without requiring the introduction of additional current. In this manner, the systems and methods provided by the present disclosure provide a significant improvement over the state of the art. Most known, high current systems (e.g., electrolyzers) measure impedance by driving additional current through the system. Additionally, it is often difficult to connect external current-driving equipment to an otherwise autonomous electrical system; the system may be compact or otherwise inaccessible (e.g., a black-box system) such that conventional techniques may be difficult or impossible to implement. The systems and methods provided by the present disclosure overcome these problems.

In a first aspect, the present disclosure provides a method of determining an impedance of an electrochemical device, comprising: electrically connecting a variable impedance in parallel with the electrochemical device; electrically connecting a power supply to the electrochemical device, the power supply generating a power supply current; modulating a current through the variable impedance; measuring a stack current flowing through the electrochemical device; measuring, at the electrochemical device, a voltage across at least a portion of the electrochemical device; and calculating, based on the measured stack current and the measured voltage, the impedance of the electrochemical device.

According to the above first aspect, a value of the measured stack current is the difference between the power supply current and the modulated current. According to either of the above aspects the modulated current is the measured stack current subtracted from the power supply current. According to any of the above aspects, the variable impedance is at least one or a combination of a Metal Oxide Semiconductor Field-Effect Transistor (MOSFET), a Junction Field-Effect Transistor (JFET), a Bipolar Junction Transistor (BJT), and/or a programmable load bank. According to any of the above aspects, in some embodiments a waveform generator modulates the variable impedance, and the waveform generator generates one or more of a square wave, a sine wave, a cosine wave, a sawtooth wave, and/or a triangle wave.

According to any of the above aspects, the stack current flowing through the electrochemical device is measured at a shunt resistor wired in series with the electrochemical device. According to any of the above aspects, the electrochemical device comprises one or more electrochemical cells. According to any of the above aspects, the method can further comprise measuring a modulated voltage associated with each of the one or more electrochemical cells. According to any of the above aspects, the method can further comprise electrically connecting a first shunt resistor in series with the variable impedance and measuring, at the first shunt resistor, the modulated current flowing through the variable impedance. According to any of the above aspects, the method can further comprise electrically connecting a second shunt resistor in series with the electrochemical device and measuring, at the second shunt resistor, the stack current flowing through the electrochemical device. According to any of the above aspects, the power supply current is at least one ampere (A). According to any of the above aspects, the power supply is a Direct Current (DC) power supply.

In a second aspect, the present disclosure provides a system for measuring the impedance of an electrochemical device, comprising: a variable impedance positioned in a first electrical circuit between a first node and a second node; means for configuring the electrochemical device to be positioned in a second electrical circuit connecting the first node and the second node; means for configuring the first node and the second node to be electrically connected to a power supply capable of providing a supply current; means for measuring a first current flowing through the first circuit; means for measuring a second current flowing through the second circuit; means for measuring a voltage across at least a portion of the electrochemical device; means for adjusting a resistance provided by the variable impedance; means for collecting an input comprising at least one of the first current, the second current, the supply current, and the voltage; and an algorithm that receives the input and calculates the impedance based on the input.

According to this second aspect, an efficiency of the electrochemical device is determined based on the calculated impedance. According to this second aspect, the variable impedance is at least one of a Metal Oxide Semiconductor Field-Effect Transistor (MOSFET), a Junction Field-Effect Transistor (JFET), a Bipolar Junction Transistor (BJT), and/or a programmable load bank. Further according to this second aspect, a waveform generator modulates the variable impedance, and generates one or more of a square wave, a sine wave, a cosine wave, a sawtooth wave, and/or a triangle wave. Still further according to this second aspect, the stack current flowing through the electrochemical device is measured at a shunt resistor wired in series with the electrochemical device. Still further according to this second aspect, the electrochemical device comprises one or more electrochemical cells.

Still further according to this second aspect, each electrochemical cell of the one or more electrochemical cells comprises a modulated voltage. Still further according to this second aspect, the system can further comprise a first shunt resistor connected in series with the variable impedance, wherein the first shunt resistor is configured to measure the modulated current flowing through variable impedance. Still further according to this second aspect, the system can further comprise a second shunt resistor connected in series with the electrochemical device, wherein the second shunt resistor is configured to measure the stack current flowing through the electrochemical device. Still further according to this second aspect, the power supply current is at least one ampere (A). Still further according to this second aspect, the power supply is a Direct Current (DC) power supply.

BRIEF DESCRIPTION OF THE DRAWINGS

Many aspects of the disclosure may be better understood with reference to the following drawings. While several implementations are described in connection with these drawings, the disclosure is not limited to the implementations disclosed herein. On the contrary, the intent is to cover all alternatives, modifications, and equivalents.

DETAILED DESCRIPTION

Described herein are methods, systems, and devices for determining the impedance of any electrochemical device utilizing a constant power supply. Among other things, the embodiments of the present disclosure discussed herein permit for the determination of impedance without the need to vary the power supply attached to the electrochemical device. Electrical impedance is the effective resistance of a circuit (or component thereof) to alternating current, and may be a measure of the healthiness, efficiency, or effectiveness of a circuit or component of a circuit. Therefore, measuring the electrical impedance of electrochemical storage and conversion may provide insight into the operational efficiency of the circuit or a component thereof and/or the presence of degradation effects on the circuit or a component thereof. The measurement of electrical impedance is dependent on the voltage and current created by the power supply, and the power supply often supplies a fixed current/voltage ratio that is specifically designed to prohibit modulation.

Methods, systems, and devices described herein may be applied to any electrochemical process that acts as a load. Examples of electrochemical devices that may benefit from the methods and systems disclosed herein may include fuel cells (e.g., hydrogen fuel cells); electrolyzer systems; electrochemical processes that act as a load such as $CO_2$ electrolyzers, chlor-alkali electrolyzers or other processes; electroplating; high-power batteries; and the like. Moreover, embodiments of the present disclosure as described herein permit impedance of a circuit (or components thereof) to be determined easily by connecting a device to any available in-house power supply; by subtracting current from the electrochemical device, a device or method of the present disclosure may be used to measure the impedance of any electrochemical device and/or impedance contributions of various elements within such electrochemical device, regardless of the characteristics of the power supply or electrochemical device. Advantageously, embodiments of the present disclosure may be used to measure impedance of electrochemical cells at any scale of operation.

Figure 1:
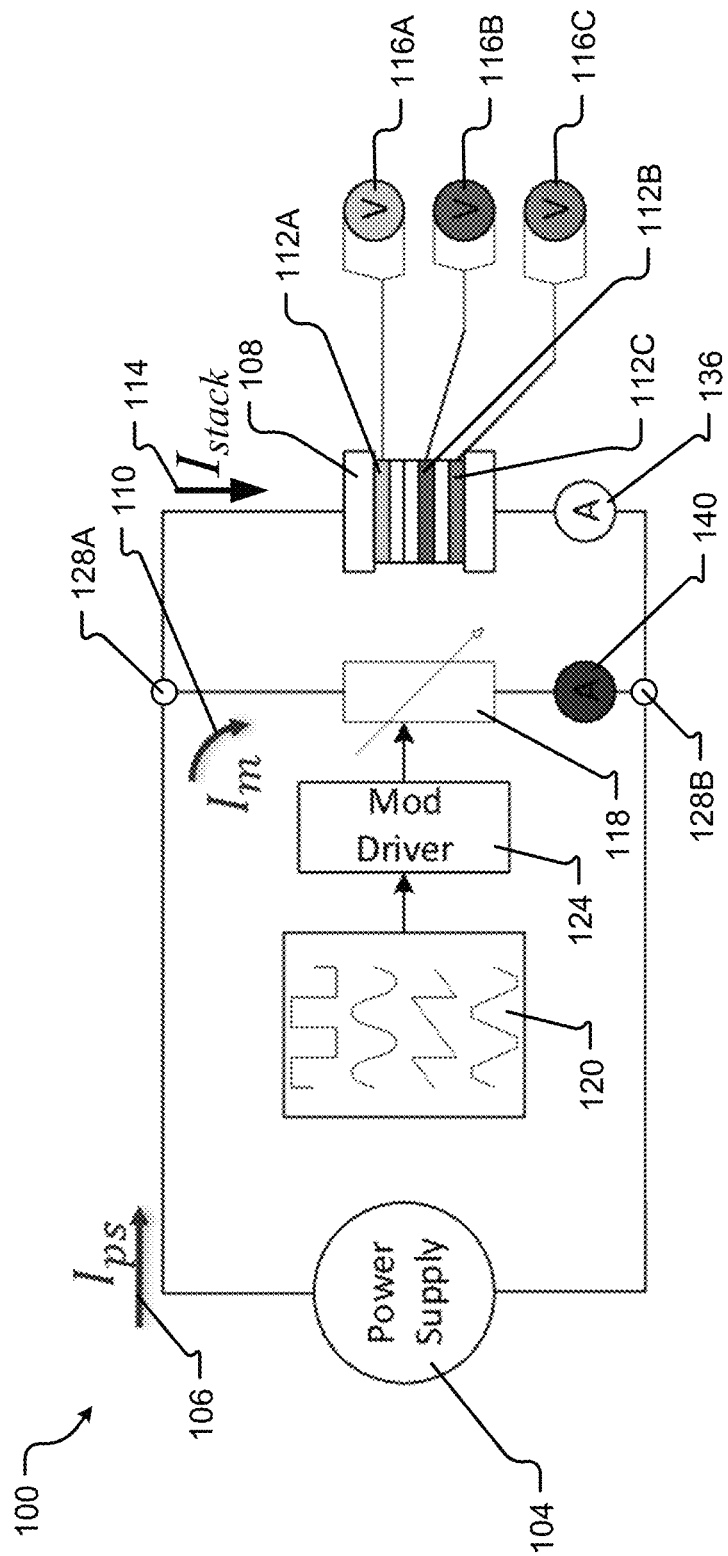
FIG. 1 illustrates a circuit schematic of a current regulating device connected to an electrochemical device, where the current regulating device subtracts current from the electrochemical device, in accordance with embodiments of the present disclosure.

FIG. 1 depicts a circuit schematic of a circuit 100 that drive a current through an electrochemical device in accordance with at least one embodiment of the present disclosure. The circuit 100 (and/or components thereof) may be used to determine the impedance of an electrochemical device 108 by using a variable impedance 118 to subtract a modulated current 110 ($I_m$) from a power supply current 106 ($I_{ps}$) generated by a power supply 104, with a resulting stack current 114 ($I_{Stack}$) flowing through the electrochemical device 108 being measured and used in the impedance determination. In the example depicted in FIG. 1, the circuit 100 includes the power supply 104, the electrochemical device 108, the variable impedance 118, and the ammeter 136. In other embodiments, the circuit 100 may contain additional or alternative components. For example, the circuit 100 may comprise additional or alternative resistors, capacitors, inductors, combinations thereof, and/or the like.

The power supply 104 is a source of power that drives the power supply current 106 through the electrochemical device 108. The power supply current 106 may be or comprise a direct current (DC) source. As shown in FIG. 1, the variable impedance 118 is placed in parallel with the electrochemical device 108, such that the stack current 114 flowing through the electrochemical device 108 is the sum of the modulated current 110 flowing through the variable impedance 118 and the power supply current 106 generated by the power supply 104. In some embodiments of the present disclosure, the variable impedance 118 may have one end electrically connected or otherwise attached to the power supply 104 at a first node 128A. Similarly, another end of the variable impedance 118 may be attached to the power supply 104 at a second node 128B to form a first circuit.

The electrochemical device 108 is a device capable of generating electric current from a chemical reaction (e.g., a battery) or may use electrical energy to create a chemical reaction. In some embodiments of the present disclosure. The electrochemical device 108 may be or include electrolyzers (devices or systems capable of performing electrolysis to produce hydrogen gas). The electrochemical device 108 may additionally or alternatively store energy therein. In some embodiments of the present disclosure, the electrochemical device 108 may be configured to detach from the circuit 100 and may be transported or used in other systems (e.g., the electrochemical device 108 may be a battery that may be charged by the circuit 100 and then disconnected to be used as a power source in a different circuit or system). In other embodiments of the present disclosure, the electrochemical device 108 may be connected to the power supply 104 at both the first node 128A and the second node 128B, as shown in FIG. 1, such that the electrochemical device 108 may be wired in parallel with the variable impedance 118 to form a second circuit. The stack current 114 may flow through the electrochemical device 108. The stack current 114 may be the combination or addition of the power supply current 106 and the modulated current 110. The stack current 114 may vary in both amplitude and frequency. For example, the stack current 114 may be on the scale of amperes (e.g., 1 Ampere (A), 2 A, 5 A, 10 A, 30 A, 50 A, 100 A, etc.) flowing through the electrochemical device 108. The ammeter 136 or other measurement circuitry may be electrically connected to the electrochemical device 108 and may be configured to measure the stack current 114 flowing through the electrochemical device 108. In at least one embodiment, the ammeter 136 may be a shunt resistor configured to permit the measurement of the stack current 114 flowing through the electrochemical device 108.

The circuit 100 may include, among other things, a modulator driver 124 configured to drive the variable impedance 118. The modulator driver 124 may provide instructions or otherwise cause the variable impedance 118 to modulate the amount of the modulated current 110 flowing therethrough. The modulator driver 124 may receive one or more waveforms from a waveform generator 120. The waveform generator 120 may be or comprise one or more waves or waveforms passed to the modulator driver 124 to vary an internal resistance of the variable impedance 118, which may in turn cause the modulated current 110 to flow through the variable impedance 118. For example, the waveform generator 120 passes a sinusoidal wave (e.g., a sine wave, a cosine wave, etc.) to the modulator driver 124, which causes a sinusoidal current to flow through the variable impedance 118 based on the changing internal resistance of the variable impedance 118. The waves may be or comprise a sine wave, a cosine wave, a sawtooth wave, a triangle wave, combinations thereof, and/or the like.

In some embodiments of the present disclosure, the waveform generator 120 and the modular driver 124 drives an internal resistance of the variable impedance 118. For instance, the variable impedance 118 may be a voltage-controlled resistor, with a voltage input (e.g., by the modular driver 124) driving a change in the internal resistance of the variable impedance 118. The modulated change in internal resistance may modulate the amount of current drawn by the variable impedance 118. Consequently, the modulated current 110 drawn by the variable impedance 118 may modulate the stack current 114 flowing through the electrochemical device 108.

The ammeter 140 may be or include a device for measuring the current flowing through one or more portions of the circuit 100. In at least one embodiment, the ammeter 140 is wired in series with the variable impedance 118. In some embodiments of the present disclosure, the ammeter 140 may be or comprise a shunt resistor. The variable impedance 118 may be or include an electrical device capable of adjusting an internal resistance to change the amount of current flowing therethrough. For example, the variable impedance 118 may be or include a Metal Oxide Semiconductor Field Effect Transistor (MOSFET), a Junction Field-Effect Transistor (JFET), a Bipolar Junction Transistor (BJT), a Darlington transistor (i.e., two bipolar transistors with an emitter of a first transistor connected to the base of a second transistor), a programmable load bank (e.g., a device programmable to deliver various waveforms), including combinations thereof, and the like. In at least one embodiment, the variable impedance 118 is wired in parallel with the electrochemical device 108, such that the variable impedance 118 draws the modulated current 110 from the power supply current 106 to create the stack current 114 flowing through the electrochemical device 108.

The electrochemical device 108 may comprise a plurality of electrochemical cells, shown in the embodiment depicted in FIG. 1 as electrochemical cells 112A, 112B, 112C. The number of electrochemical cells (112) may vary, and fewer/additional electrochemical cells may be present in the electrochemical device 108. The depiction of three electrochemical cells 112A-112C in FIG. 1 is merely for illustrative purposes. The electrochemical cells 112A-112C may be or include electrolytic cells (e.g., cells intended for water electrolysis). In at least one embodiment, the electrochemical cells 112 may include a Proton Exchange Membrane (PEM) or an Anion Exchange Membrane (AEM) to perform water electrolysis.

The plurality of electrochemical cells 112 (e.g., 112A-112C in FIG. 1) may be configured to convert electricity and water into hydrogen and oxygen and may each comprise an anode and a cathode with a membrane therebetween. The anode is the location where oxidation occurs (i.e., water molecules are stripped of their electrons) and thus the area at or near the anode comprises water that may be oxidized to produce oxygen, protons, and electrons according to the following half reaction:

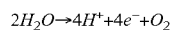

$2H_2O \rightarrow 4H^+ + 4e^- + O_2$

In some embodiments of the present disclosure, oxygen gas produced by the electrochemical cells 112 is removed from the anode.

A cathode is the location where reduction occurs (i.e., where positively charged hydrogen ions (protons) gain electrons and form hydrogen gas). The cathode may be supplied with electrons and protons (with the protons moving across a proton exchange membrane between the anode and cathode) that form hydrogen gas according to the following half reaction:

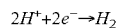

$2H^+ + 2e^- \rightarrow H_2$

In some embodiments of the present disclosure, hydrogen gas produced by the electrochemical cells 112 is removed from the cathode.

In some embodiments, a proton exchange membrane may be positioned between a cathode and an anode to permit the diffusion of protons therethrough. During the oxidation-reduction process within an electrochemical cell (e.g., 112A), after oxidation at the cathode, protons (positively charged hydrogen ions) diffuse through the proton exchange membrane and move to the cathode, where they come into contact with electrons and become reduced, forming elemental hydrogen that reacts with itself to create hydrogen gas.

In some embodiments, the circuit 100 may include, be connected to, or in communication with a controller, processor, or other computing device (not shown). The processor may be any processor configured to execute instructions stored in the memory, which instructions may cause the processor to carry out one or more computing steps utilizing or based on data received from the circuit 100 (e.g., voltage measurements, current measurements, etc.), such as determining an impedance associated with the circuit 100 (or components thereof).

A plurality of voltages 116A, 116B, 116C exist respectively across the plurality of cells 112A, 112B, 112C. The plurality of voltages 116 indicate respective voltage drops across the respective plurality of cells 112. In some embodiments, the plurality of voltages 116 may be measured (e.g., using a voltmeter, a potentiometer, or the like) and used in conjunction with a measured stack current 114 to determine an effective impedance of each of the plurality of cells 112 and/or of an electrochemical device 108. In some embodiments, the plurality of voltages 116 may be measured across each respective cathode and anode of the plurality of cells 112. For instance, a voltmeter may be connected to each of the plurality of cells 112 such that a first probe of the voltmeter contacts the cathode of the cell 112, while a second probe of the voltmeter contacts the anode of the cell 112. The voltage reading associated with each cell 112 may then be captured (e.g., stored in a database (not shown), the voltage reading data is streamed to a memory, processor, or the like, etc.) and used in an impedance calculation.

In various embodiments, the memory connected to the processor may be or comprise RAM, DRAM, SDRAM, other solid-state memory, any memory described herein, or any other tangible, non-transitory memory for storing computer-readable data and/or instructions. The memory may store information or data useful for completing, for example, any step of the method 300 described hereinbelow, or of any other methods. The memory may store, for example, one or more algorithms. Such instructions or algorithms may, in some embodiments of the present disclosure, be organized into one or more applications, modules, packages, layers, or engines. The algorithms and/or instructions cause the processor to manipulate data stored in the memory and/or received from or via the circuit 100 to determine an impedance associated with the circuit 100 and/or the electrochemical device 108 (and/or one or more components thereof).

In some embodiments a device may be utilized to perform the method described herein. A device for determining the impedance of any electrochemical device may include:

one or more wires (e.g., conductive wires, semi-flexible conductive wires), busbars, conductive paste, and/or combinations thereof for configuring the electrochemical device to be positioned in a second electrical circuit connecting the first node and the second node;

one or more wires (e.g., conductive wires, semi-flexible conductive wires), busbars, conductive paste, and/or combinations thereof for configuring the first node and the second node to be electrically connected to a power supply capable of providing a supply current;

an ammeter and/or galvanometer for measuring a first current flowing through the first circuit;

an ammeter and/or galvanometer for measuring a second current flowing through the second circuit;

a voltmeter, electrostatic voltmeter, potentiometer, electronic voltmeter, multimeter, volt-ohm-milliammeter (VOM), and/or combinations thereof for measuring a voltage across at least a portion of the electrochemical device;

a rheostat, potentiometer, thermistor, and/or combinations thereof for adjusting a resistance provided by the variable impedance;

a controller, control unit, data acquisition unit, processor, microprocessor, chip, memory, non-volatile memory, database, RAM, and/or combinations thereof for collecting an input comprising at least one of the first current, the second current, the supply current, and the voltage; and an algorithm that receives the input and calculates the impedance based on the input.

Figure 2:
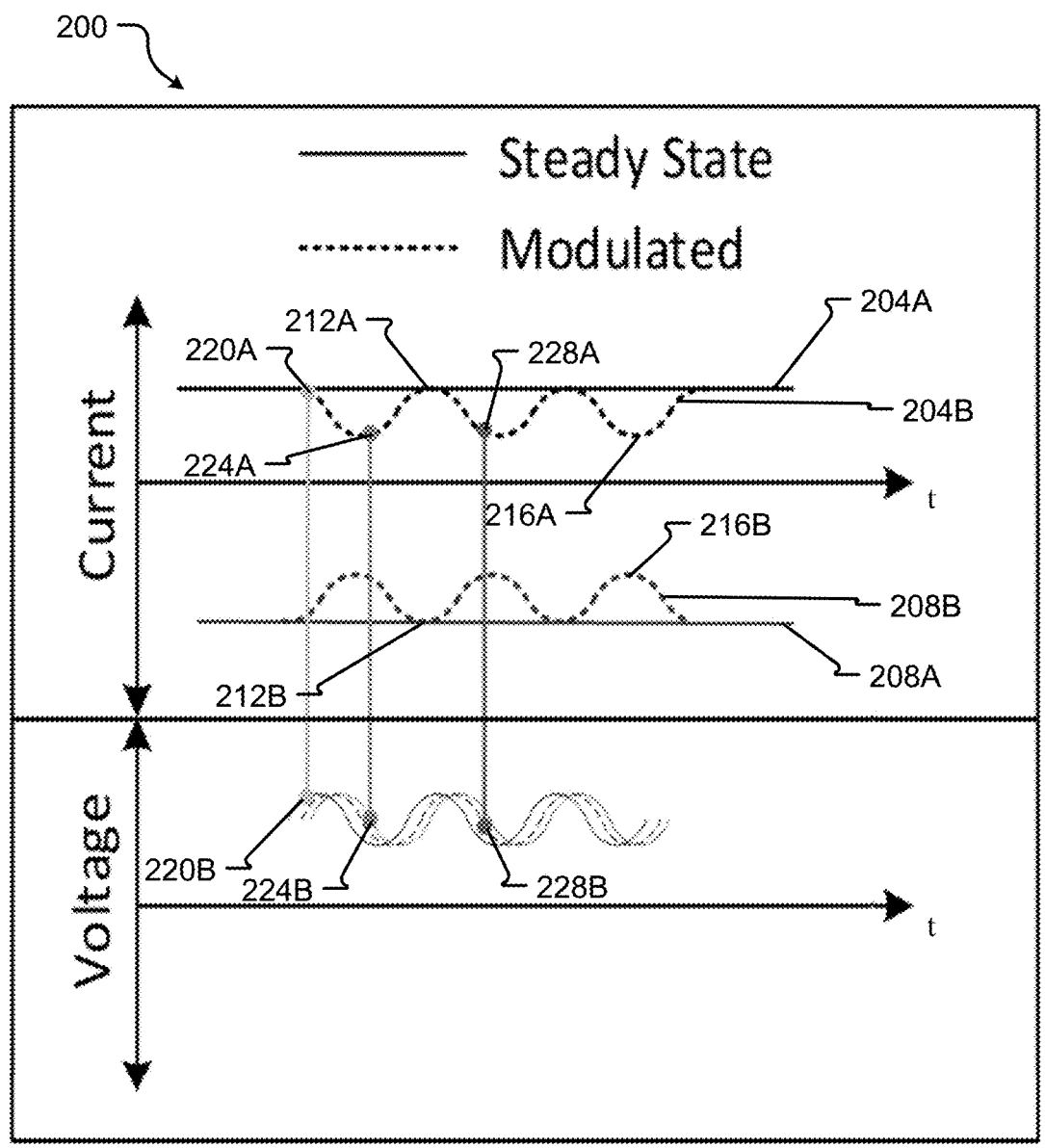
FIG. 2 illustrates a chart depicting voltage and current of the current regulating device and the electrochemical device as the current regulating device regulates the electrochemical device, in accordance with embodiments of the present disclosure.

Referring now to FIG. 2, a chart 200 of current and voltage readings in accordance with embodiments of the present disclosure is provided. The depicted chart 200 shows measurements generated by operation of the circuit 100 provided by the present disclosure, captured by measurement circuitry or instruments associated with such a circuit 100 (e.g., ammeters, voltmeters, oscilloscopes, high speed Digital to Analog Converters, high speed Analog to Digital Converters, other high bandwidth instruments, etc.), as described herein. The chart 200 depicts voltage and current in both steady state (shown with solid lines) and in a modulated state (shown with dotted lines). The current measurements show the oscillatory relationship between the current flowing through different components of the circuit 100, while the corresponding voltage readings are tied to the current values based on phase shifts dependent on the frequency of the signals supplied to the variable impedance 118. Both the current and voltage measurements may be used to determine the impedance of, for example, the electrochemical device 108.

The chart 200 depicts a steady state stack current 204A and a steady state load current 208A. The steady state stack current 204A may be or comprise a stack current (e.g., the stack current 114) passing through an electrochemical device (e.g., the electrochemical device 108) at steady state operation and the steady state load current 208A may be or include a current passing through a variable impedance (e.g., the variable impedance 118) during steady state operation. For example, a variable impedance may have a constant voltage applied thereto, resulting in a constant internal resistance and subsequently a constant current flowing therethrough. The steady state stack current 204A may be measured, for example, by an ammeter (e.g., the ammeter 136 or other measurement circuitry or instrumentation measures the steady state stack current 204A) wired in series with the electrochemical device 108 during a steady state operation of the circuit 100. The steady state load current 208A may be measured, for example, by an ammeter (e.g., the ammeter 140) wired in series with the variable impedance 118 during a steady state operation of the circuit 100.

The chart 200 of FIG. 2 also illustrates voltage and current measurements for when the circuit 100 is modulated. For instance, a modulated stack current 204B and a modulated load current 208B may be shown. The modulated stack current 204B may be the stack current 114 flowing through the electrochemical device 108, as illustrated in FIG. 1, when the variable impedance 118 is in a modulated operation (e.g., the circuit 100 may be modulated by the modulator driver 124). The modulated load current 208B may be the modulated current 110, illustrated in FIG. 1, flowing through the variable impedance 118 during modulated operation of the circuit 100. The modulated stack current 204B may be measured, for example, by the ammeter 136 wired in series with the electrochemical device 108 during the modulated operation of the circuit 100. The modulated load current 208B may be measured, for example, by the ammeter 140 wired in series with the variable impedance 118 during the modulated operation of the circuit 100. The modulated stack current 204B may oscillate in time, as shown in FIG. 2.

When the circuit 100 transitions from a steady state to a modulated state (e.g., when the modulator driver 124 uses the waveform generator 120 to create a variable resistance in the variable impedance 118), a modulated current 110 may flow through the variable impedance 118 at various magnitudes over time. As shown by the sinusoidal nature of the currents in FIG. 2, when the modulated stack current 204B is at a peak 212A, a corresponding modulated load current 208B is in a trough 212B. Similarly, when the modulated stack current 204B is in a trough 216A, the corresponding modulated load current 208B is at a peak 216B. This synchronous behavior may be attributed to the fluctuations of the modulated current 110 flowing into the variable impedance 118; as the amount of current flowing into the modulated current 110 increases or decreases, the amount of current flowing into the electrochemical device 108 decreases or increases, respectively.

One or more voltages (e.g., voltages 116A-116C) are measured, as reflected in the chart 200 of FIG. 2. For example, a first voltage 220B, a second voltage 224B, and a third voltage 228B may correspond to voltage measurements taken with respect to respective electrochemical cells 112A-112C of the electrochemical device 108. In some embodiments of the present disclosure, the first voltage 220B, the second voltage 224B, and the third voltage 228B correspond to a first current 220A, a second current 224A, and a third current 228A. For example, a first voltage 220B is measured by a voltmeter connected to a first electrochemical cell 112A, while a first current 220A is measured by the ammeter 140 connected in series with the variable impedance 118.

Figure 3:
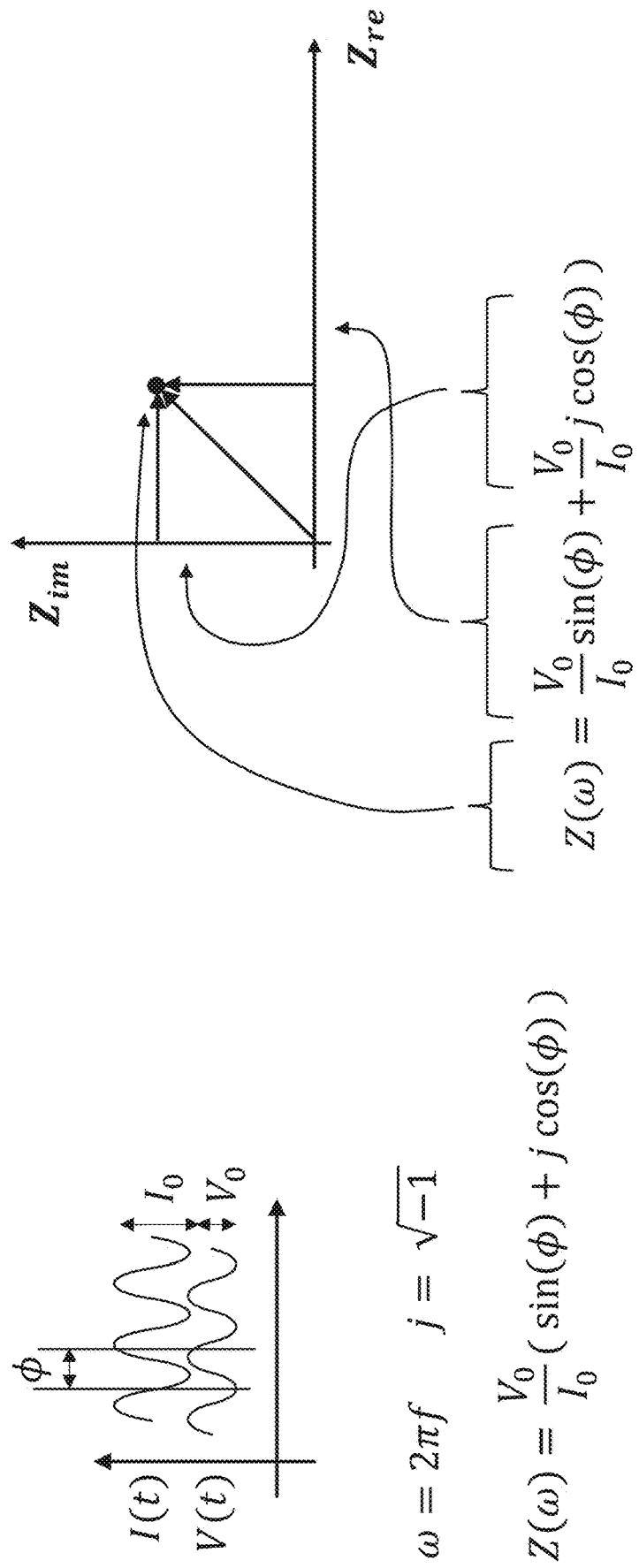
FIG. 3 illustrates an example, where impedance is determined by determining a phase angle difference between a measured voltage a current, and using trigonometry to determine the impedance, in accordance with embodiments of the present disclosure.

By modulating the current flowing through the variable impedance 118 and the electrochemical device 108, a current-voltage phase shift may occur. For instance, the current may lag or lead the voltage depending on the connection and/or presence of electrical components (e.g., resistors, capacitors, inductors, etc.) in a circuit (e.g., the circuit 100). In some embodiments, the current and voltage measurements are used to determine the effective impedance of the electrochemical device 108 and/or the plurality of electrochemical cells 112A-112C. In other embodiments of the present disclosure, the impedance of components of the circuit 100 may be a function of frequency, a stack current flowing through the electrochemical device 108, a voltage (or plurality of voltages) across the electrochemical device 108, and/or a phase shift between a measured current and voltage (or plurality of voltages). Various methods of determining impedance from a measured voltage and current may be implemented. As an example, the impedance is determined by determining a phase angle difference between the measured voltage and current, and using trigonometry to determine the impedance using the following equation:

$$Z(\omega) = \frac{V_0}{I_0}(\sin(\phi) + j\cos(\phi))$$

where phi ($\phi$) is the phase angle between the current and voltage, omega ($\omega$) is $2\pi$ times the frequency of the signal driven by a modulator driver 124, and j is the imaginary unit, as shown in FIG. 3.

As another example, a Fast Fourier Transform (FFT) is performed on a measured voltage and current to generate signals in a frequency domain. The signals are then passed through an arctan function (i.e., 1/tan(x)) to determine the phase of both signals.

Figure 4:
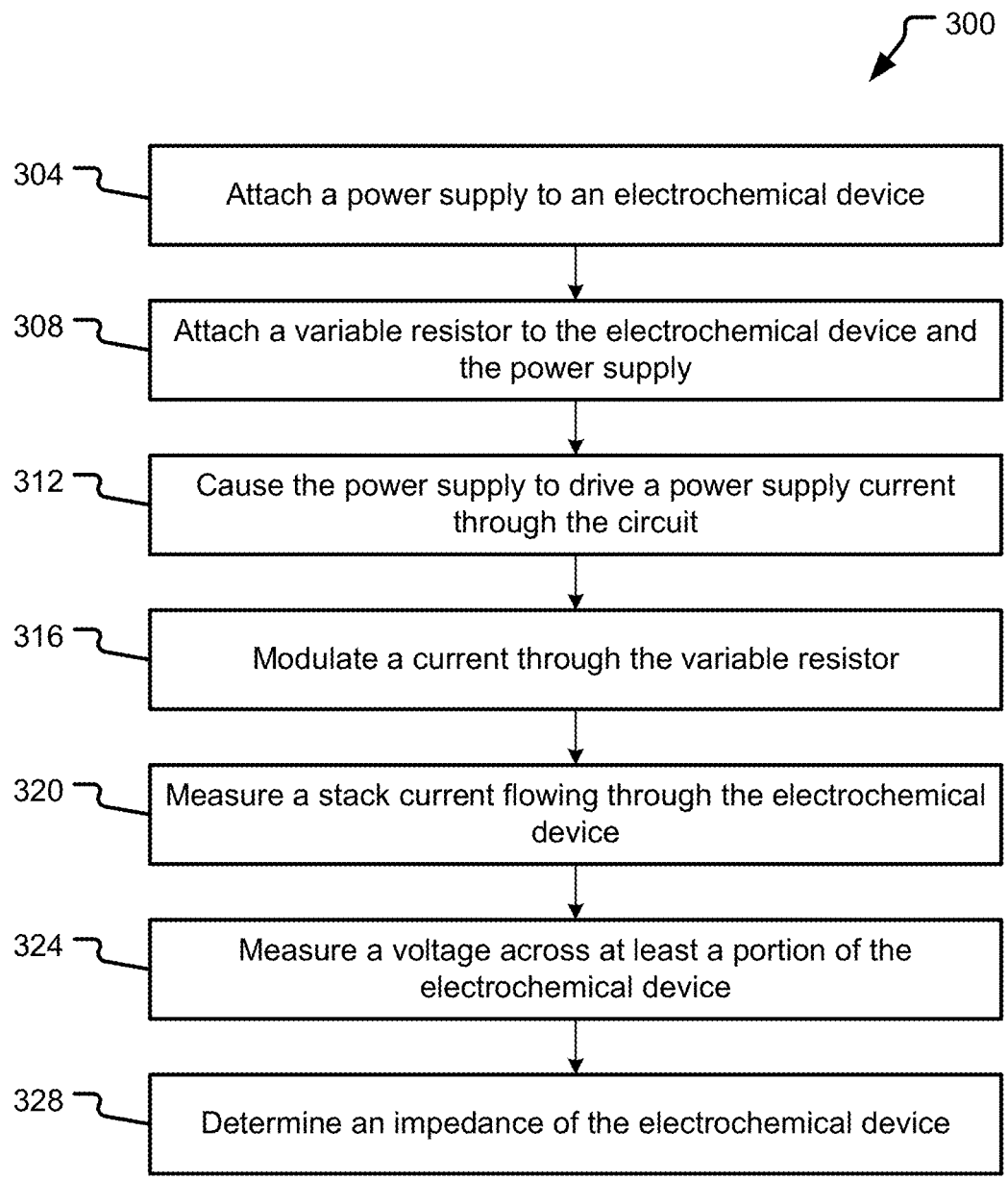
FIG. 4 illustrates a block diagram of a method of regulating current flowing through an electrochemical device to determine the impedance of the electrochemical device, in accordance with embodiments of the present disclosure.

FIG. 4 depicts a method 300 that may be used, for example, to determine an impedance of an electrochemical device (e.g., the electrochemical device 108) as described herein. The method 300, or one or more aspects thereof, may be used to, for example, identify issues associated with the electrochemical device, such as when the electrochemical device may not be properly conducting or storing charge.

The steps of the method 300 are referenced parenthetically in the paragraphs that follow, along with references to the elements and systems from the circuit 100 of FIG. 1. While a general order for the steps of the method 300 is shown in FIG. 4, the method 300 may include more or fewer steps or can arrange the order of the steps differently than those shown in FIG. 4.

The method 300 includes attaching a power supply to an electrochemical device (step 304). The power supply may be similar to or the same as power supplies mentioned herein (e.g., the power supply 104) and the electrochemical device may be similar to or the same as electrochemical devices mentioned herein (e.g., the electrochemical device 108) and/or may comprise a plurality of electrochemical cells (e.g., the plurality of electrochemical cells 112A-112C). The power supply 104 is attached to the electrochemical device 108, in some embodiments as illustrated in FIG. 1, where the power supply is connected to the electrochemical device (e.g., in series), such that the power supply drives a power supply current therethrough.

The method 300 also includes attaching a variable impedance to the electrochemical device and the power supply (step 308). In some embodiments of the present disclosure, a variable impedance (e.g., the variable impedance 118) may be or include a voltage-controlled resistor (e.g., a MOSFET), such that the modulation of voltage may result in a modulated current flowing through the voltage-controlled resistor. In at least one embodiment, the variable impedance may be wired or connected in parallel with the electrochemical device, such that a power supply current is split between the variable impedance and the electrochemical device based on the impedance of each device.

The method 300 further includes causing a power supply to drive a power supply current through a circuit (e.g., the circuit 100) (step 312). A power supply may be a direct current source connected to both the variable impedance and the electrochemical device. In some embodiments of the present disclosure, a power supply current may flow through each device in a circuit (e.g., the variable impedance, the electrochemical device, etc.) based on the impedance of each device (e.g., the lower the device impedance, the more current the device draws).

The method 300 also includes modulating a current through the variable impedance (step 316). As previously mentioned, the variable impedance may be a voltage-controlled resistor, such that the resistance (or impedance) of the variable impedance may be modulated. The modulation of the variable impedance causes varying amounts of current to flow through the variable impedance over time; as the resistance of the variable impedance changes, the amount of current flowing through (and subsequently the amount of current flowing through the electrochemical device) varies. In some embodiments of the present disclosure, a voltage-controlled resistor generates a modulated voltage or resistance based on a waveform passed thereto (e.g., the modulator driver 124 drives the voltage in the shape of a wave form selected from or generated by the waveform generator 120) such that the resistance of the variable impedance draws a modulated current.

The method 300 also includes measuring a current flowing through the electrochemical device (step 320). For example, the current flowing through the electrochemical device 108 is measured. The current flowing through the electrochemical device may be measured by an ammeter (e.g., the ammeter 136) or other measurement circuitry wired in series with an electrochemical device. In some embodiments of the present disclosure, a processor receives the measured current, and stores the measured current (e.g., in a database, temporarily in a memory, etc.).

The method 300 also includes determining a voltage across at least a portion of the electrochemical device (step 324). In some embodiments of the present disclosure, a voltage drop across the electrochemical device is determined based on one or more voltmeters (or other measurement circuitry) connected to the electrochemical device (or portions thereof) to measure the voltage drop across the electrochemical device. In some embodiments, a plurality of voltmeters may be connected to a respective plurality of electrochemical cells in an electrochemical device and may be used to measure the voltage drop across an electrochemical device.

Figure 5:
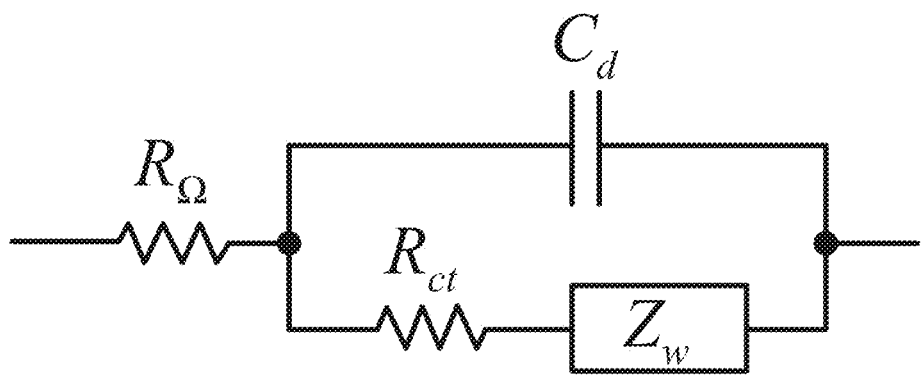
FIG. 5 illustrates an example of a Randles circuit, in accordance with embodiments of the present disclosure.

The method 300 also includes determining an impedance of the electrochemical device (step 328). In some embodiments of the present disclosure, the current flowing through the electrochemical device is used in conjunction with additional measurements (e.g., voltage drops across each individual electrochemical cell in the electrochemical device) to determine an impedance of the electrochemical device and/or of the individual electrochemical cells in the electrochemical device. In some embodiments of the present disclosure, the impedance of each individual electrochemical cell in the electrochemical device may additionally or alternatively calculated. The measurement of impedance may be used diagnostically to determine, for example, the overall health, utility, and/or functionality of the electrochemical device (or components thereof). For example, the impedance calculation is used in the context of a Randles circuit to determine how the electrochemical device is functioning. An example of a Randles circuit is shown in FIG. 5.

Figure 6:
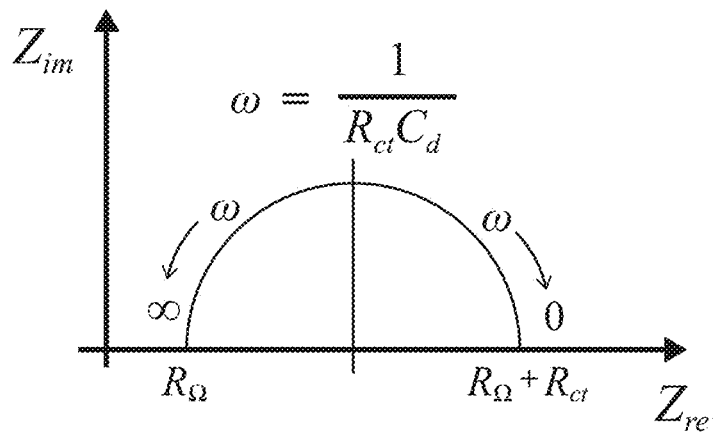
FIG. 6 illustrates how degradation of an electrochemical device may show an increase in $R\Omega$ and $R_{ct}$, in accordance with embodiments of the present disclosure.
Figure 6:
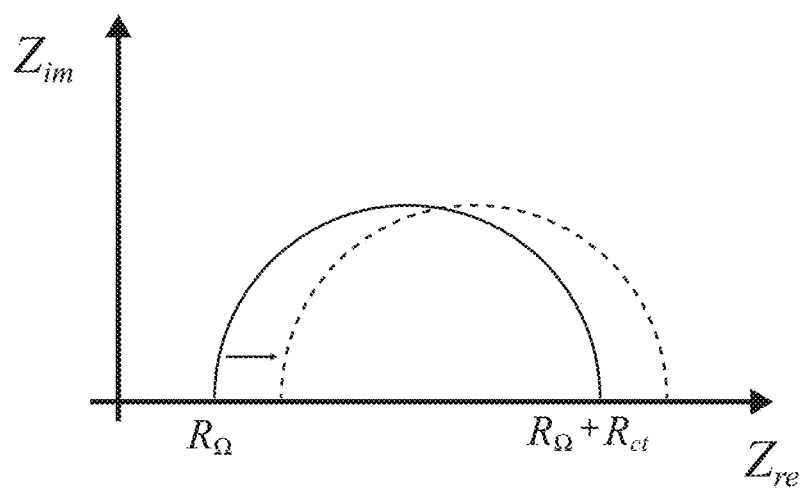

At high frequencies, the $Z_W$ component (corresponding to the calculated impedance) may be negligible to the $R_{ct}$ (a charge transfer resistance) component and $C_d$ (a double layer capacitor) essentially has 0 impedance. Since $C_d$ is a capacitor, the impedance is purely imaginary, leaving only a real impedance value associated with the resistor $R_{ct}$, which is known as High Frequency Resistance (HFR). At low frequencies, both the $C_d$ and the $Z_W$ impedance values are ignored, resulting in an impedance value equivalent to $R_\Omega + R_{ct}$. Degradation of an electrochemical device may show an increase in $R_\Omega$ and $R_{ct}$, as shown in the FIG. 6.

Notwithstanding the foregoing, the determined impedance may be used alternatively. Furthermore, the use of the Randles circuit may be influenced by or implemented with additional factors (e.g., not just device health, but device efficiency, how a device is operating, electrochemical interactions occurring within the cell, etc.).

Any of the steps, functions, and operations discussed herein may be performed continuously and/or automatically.

The methods and system of this disclosure have been described in relation to determining the impedance of an electrochemical device. However, to avoid unnecessarily obscuring the present disclosure, the preceding description omits a number of known structures and devices. This omission is not to be construed as a limitation of the scope of the claimed disclosure. Specific details are set forth to provide an understanding of the present disclosure. It should, however, be appreciated that the present disclosure may be practiced in a variety of ways beyond the specific detail set forth herein.

Furthermore, while the embodiments illustrated herein show the various components of the system collocated, certain components of the system may be located remotely, at distant portions of a distributed network, such as a LAN and/or the Internet, or within a dedicated system. Thus, it should be appreciated, that the components of the system may be combined into one or more devices, such as a server, communication device, or collocated on a particular node of a distributed network, such as an analog and/or digital telecommunications network, a packet-switched network, or a circuit-switched network. It will be appreciated from the preceding description, and for reasons of computational efficiency, that the components of the system may be arranged at any location within a distributed network of components without affecting the operation of the system.

Furthermore, it should be appreciated that the various links connecting the elements may be wired or wireless links, or any combination thereof, or any other known or later developed element(s) that is capable of supplying and/or communicating data to and from the connected elements. These wired or wireless links may also be secure links and may be capable of communicating encrypted information. Transmission media used as links, for example, may be any suitable carrier for electrical signals, including coaxial cables, copper wire, and fiber optics, and may take the form of acoustic or light waves, such as those generated during radio-wave and infra-red data communications.

While the flowcharts have been discussed and illustrated in relation to a particular sequence of events, it should be appreciated that changes, additions, and omissions to this sequence may occur without materially affecting the operation of the disclosed embodiments, configuration, and aspects.

A number of variations and modifications of the disclosure may be used. It would be possible to provide for some features of the disclosure without providing others.

In yet another embodiment, the systems and methods of this disclosure may be implemented in conjunction with a special purpose computer, a programmed microprocessor or microcontroller and peripheral integrated circuit element(s), an ASIC or other integrated circuit, a digital signal processor, a hard-wired electronic or logic circuit such as discrete element circuit, a programmable logic device or gate array such as PLD, PLA, FPGA, PAL, special purpose computer, any comparable means, or the like. In general, any device(s) or means capable of implementing the methodology illustrated herein may be used to implement the various aspects of this disclosure. Examples of hardware that may be used for the present disclosure includes computers, handheld devices, telephones (e.g., cellular, Internet enabled, digital, analog, hybrids, and others), and other hardware known in the art. Some of these devices include processors (e.g., a single or multiple microprocessors), memory, nonvolatile storage, input devices, and output devices. Furthermore, alternative software implementations including, but not limited to, distributed processing or component/object distributed processing, parallel processing, or virtual machine processing may also be constructed to implement the methods described herein.

In yet another embodiment, the disclosed methods may be readily implemented in conjunction with software using object or object-oriented software development environments that may provide portable source code that may be used on a variety of computer or workstation platforms. Alternatively, the disclosed system may be implemented partially or fully in hardware using standard logic circuits or VLSI design. Whether software or hardware is used to implement the systems in accordance with this disclosure is dependent on the speed and/or efficiency requirements of the system, the particular function, and the particular software or hardware systems or microprocessor or microcomputer systems being utilized.

In yet another embodiment, the disclosed methods may be partially implemented in software that may be stored on a storage medium, executed on programmed general-purpose computer with the cooperation of a controller and memory, a special purpose computer, a microprocessor, or the like. In these instances, the systems and methods of this disclosure may be implemented as a program embedded on a personal computer such as an applet, JAVA® or CGI script, as a resource residing on a server or computer workstation, as a routine embedded in a dedicated measurement system, system component, or the like. The system may also be implemented by physically incorporating the system and/or method into a software and/or hardware system.

Although the present disclosure describes components and functions implemented in the embodiments with reference to particular standards and protocols, the disclosure is not limited to such standards and protocols. Other similar standards and protocols not mentioned herein are in existence and are considered to be included in the present disclosure. Moreover, the standards and protocols mentioned herein and other similar standards and protocols not mentioned herein are periodically superseded by faster or more effective equivalents having essentially the same functions. Such replacement standards and protocols having the same functions are considered equivalents included in the present disclosure.

The present disclosure, in various embodiments, configurations, and aspects, includes components, methods, processes, systems and/or apparatus substantially as depicted and described herein, including various embodiments, sub combinations, and subsets thereof. Those of skill in the art will understand how to make and use the systems and methods disclosed herein after understanding the present disclosure. The present disclosure, in various embodiments, configurations, and aspects, includes providing devices and processes in the absence of items not depicted and/or described herein or in various embodiments, configurations, or aspects hereof, including in the absence of such items as may have been used in previous devices or processes, e.g., for improving performance, achieving ease, and/or reducing cost of implementation.

The foregoing discussion of the disclosure has been presented for purposes of illustration and description. The foregoing is not intended to limit the disclosure to the form or forms disclosed herein. In the foregoing Detailed Description for example, various features of the disclosure are grouped together in one or more embodiments, configurations, or aspects for the purpose of streamlining the disclosure. The features of the embodiments, configurations, or aspects of the disclosure may be combined in alternate embodiments, configurations, or aspects other than those discussed above. This method of disclosure is not to be interpreted as reflecting an intention that the claimed disclosure requires more features than are expressly recited in each claim. Rather, as the following claims reflect, inventive aspects lie in less than all features of a single foregoing disclosed embodiment, configuration, or aspect. Thus, the following claims are hereby incorporated into this Detailed Description, with each claim standing on its own as a separate preferred embodiment of the disclosure.

Moreover, though the description of the disclosure has included description of one or more embodiments, configurations, or aspects and certain variations and modifications, other variations, combinations, and modifications are within the scope of the disclosure, e.g., as may be within the skill and knowledge of those in the art, after understanding the present disclosure. It is intended to obtain rights, which include alternative embodiments, configurations, or aspects to the extent permitted, including alternate, interchangeable and/or equivalent structures, functions, ranges, or steps to those claimed, whether or not such alternate, interchangeable and/or equivalent structures, functions, ranges, or steps are disclosed herein, and without intending to publicly dedicate any patentable subject matter.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The term "a" or "an" entity refers to one or more of that entity. As such, the terms "a" (or "an"), "one or more," and "at least one" can be used interchangeably herein. It is also to be noted that the terms "comprising," "including," and "having" can be used interchangeably.

The term "automatic" and variations thereof, as used herein, refers to any process or operation, which is typically continuous or semi-continuous, done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

Aspects of the present disclosure may take the form of an embodiment that is entirely hardware, an embodiment that is entirely software (including firmware, resident software, micro-code, etc.) or an embodiment combining software and hardware aspects that may all generally be referred to herein as a "circuit," "module," or "system." Any combination of one or more computer-readable medium(s) may be utilized. The computer-readable medium may be a computer-readable signal medium or a computer-readable storage medium.

A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electromagnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device. Program code embodied on a computer-readable medium may be transmitted using any appropriate medium, including, but not limited to, wireless, wireline, optical fiber cable, RF, etc., or any suitable combination of the foregoing.

The terms "determine," "calculate," "compute," and variations thereof, as used herein, are used interchangeably and include any type of methodology, process, mathematical operation or technique.

What is claimed is:

1. A method of determining an impedance of an electrochemical device, comprising:
   electrically connecting a variable impedance in parallel with the electrochemical device;
   electrically connecting a power supply to the electrochemical device, the power supply generating a power supply current;
   modulating a current through the variable impedance;
   measuring a stack current flowing through the electrochemical device;
   measuring, at the electrochemical device, a voltage across at least a portion of the electrochemical device; and
   calculating, based on the measured stack current and the measured voltage, the impedance of the electrochemical device, wherein:
   a waveform generator modulates the variable impedance, and
   the waveform generator generates a wave form selected from a square wave, a sine wave, a cosine wave, a sawtooth wave, a triangle wave, and combinations thereof.

2. The method of claim 1, wherein the measured stack current is the difference between the power supply current and the modulated current.

3. The method of claim 1, wherein the modulated current is the measured stack current subtracted from the power supply current.

4. The method of claim 1, further comprising:
   determining, based on the calculated impedance, an efficiency of the electrochemical device.

5. The method of claim 1, wherein the variable impedance is selected from a Metal Oxide Semiconductor Field-Effect Transistor (MOSFET), a Junction Field-Effect Transistor (JFET), a Bipolar Junction Transistor (BJT), a programmable load bank, and combinations thereof.

6. The method of claim 1, wherein the stack current is measured at a shunt resistor wired in series with the electrochemical device.

7. The method of claim 1, wherein the electrochemical device comprises one or more electrochemical cells.

8. The method of claim 7, further comprising:
   measuring a modulated voltage associated with each of the one or more electrochemical cells.

9. The method of claim 1, further comprising:
   electrically connecting a first shunt resistor in series with the variable impedance; and
   measuring, at the first shunt resistor, the modulated current flowing through the variable impedance.

10. The method of claim 9, further comprising:
    electrically connecting a second shunt resistor in series with the electrochemical device; and
    measuring, at the second shunt resistor, the stack current flowing through the electrochemical device.

11. The method of claim 1, wherein the power supply current is at least one ampere (A).

12. The method of claim 1, wherein the power supply is a Direct Current (DC) power supply.

13. A system for measuring the impedance of an electrochemical device, comprising:
    a variable impedance positioned in a first electrical circuit between a first node and a second node;
    means for configuring the electrochemical device to be positioned in a second electrical circuit connecting the first node and the second node;
    means for configuring the first node and the second node to be electrically connected to a power supply providing a supply current;
    means for measuring a first current flowing through the first circuit;
    means for measuring a second current flowing through the second circuit;
    means for measuring a voltage across at least a portion of the electrochemical device;
    means for adjusting a resistance provided by the variable impedance;
    means for collecting an input comprising at least one of the first current, the second current, the supply current, and the voltage; and
    a processor that receives the input and calculates the impedance based on the input, wherein:
    a waveform generator modulates the variable impedance, and
    the waveform generator generates a wave form selected from a square wave, a sine wave, a cosine wave, a sawtooth wave, a triangle wave, and combinations thereof.

14. The system of claim 13, wherein an efficiency of the electrochemical device is determined based on the calculated impedance.

15. The system of claim 13, wherein the variable impedance is selected from a Metal Oxide Semiconductor Field-Effect Transistor (MOSFET), a Junction Field-Effect Transistor (JFET), a Bipolar Junction Transistor (BJT), a programmable load bank, and combinations thereof.

16. The system of claim 13, wherein a stack current flowing through the electrochemical device is measured at a shunt resistor wired in series with the electrochemical device.

17. The system of claim 13, wherein the electrochemical device comprises one or more electrochemical cells.

18. The system of claim 17, wherein each electrochemical cell of the one or more electrochemical cells comprises a modulated voltage.

19. The system of claim 13, further comprising:
a first shunt resistor connected in series with the variable impedance, wherein the first shunt resistor is configured to measure the modulated current flowing through variable impedance.

20. The system of claim 19, further comprising:
a second shunt resistor connected in series with the electrochemical device, wherein the second shunt resistor is configured to measure the stack current flowing through the electrochemical device.

21. The system of claim 14, wherein the power supply current is at least one ampere (A).

22. The system of claim 13, wherein the power supply is a Direct Current (DC) power supply.

* * * * *